United States Patent [19]

Ando et al.

[11] Patent Number: 5,252,355
[45] Date of Patent: Oct. 12, 1993

[54] PROCESS FOR PRODUCING MULTILAYERED PRINTED BOARD

[75] Inventors: Kazuhiro Ando; Takamasa Kawakami; Yasuhiro Shouji, all of Ibaraki; Yasuo Tanaka, Tokyo; Takeo Kanaoka, Tokyo; Norio Sayama, Tokyo, all of Japan

[73] Assignee: Mitsubishi Gas Chemical Co., Inc., Tokyo, Japan

[21] Appl. No.: 738,013

[22] Filed: Jul. 30, 1991

[30] Foreign Application Priority Data

Jul. 30, 1990 [JP] Japan ................................. 2-199210
Oct. 18, 1990 [JP] Japan ................................. 2-277884
Oct. 18, 1990 [JP] Japan ................................. 2-277885
Oct. 24, 1990 [JP] Japan ................................. 2-284203

[51] Int. Cl.$^5$ ........................................... C23C 26/00
[52] U.S. Cl. ..................................... 427/98; 427/96; 427/97; 427/337
[58] Field of Search ...................... 427/97, 98, 96, 337

[56] References Cited

U.S. PATENT DOCUMENTS 4,775,444 10/1988 Cordani ................................. 427/97
5,076,864 12/1991 Tanaka ................................. 427/97

Primary Examiner—Shrive Beck
Assistant Examiner—Vi Duong Dang
Attorney, Agent, or Firm—Sughrue, Mion, Zinn, Macpeak & Seas

[57] ABSTRACT

A process for producing a multilayered printed circuit board which comprises using, as an intermediate layer, an inner-layer board obtained by chemically oxidizing the surface of a copper foil constituting an outermost layer of an inner-layer board having a printed circuit formed in the copper foil, thereby to form on the surface a finely roughened layer constituted by a copper oxide of a brown to black color, and then reducing the copper oxide constituting the finely roughened layer in an atmosphere in which a reducing gas is present.

12 Claims, 4 Drawing Sheets

PROCESS FOR PRODUCING MULTILAYERED PRINTED BOARD

FIELD OF THE INVENTION

The present invention relates to a process for producing a multilayered printed circuit board which has been made substantially free from "harrow" or "pink ring" by conducting gas-phase reduction The process of the present invention is characterized in that copper oxide constituting the finely roughened copper-oxide layer on the surface of a copper foil in an inner-layer board to be used as an intermediate layer is reduced preferably to copper metal in a gas phase without substantially changing the finely roughened surface state of the copper oxide layer, or that copper oxide constituting the finely roughened copper-oxide layer in at least those parts of an inner layer board which are close to through-holes is reduced preferably to copper metal in a gas phase.

BACKGROUND OF THE INVENTION

Multilayered printed circuit boards are being produced mainly by (a) a mass laminating technique and (b) a pin laminating technique. In these techniques, a printed circuit board for inner layer use (hereinafter, referred to as "inner-layer board") is first manufactured, this inner-layer board is combined with prepregs and either a copper foil or a single-side copper-clad laminate, and the superposed laminating materials are laminated to give a multilayered board both sides of which are constituted by a copper foil. This multilayered board is subjected to processing steps such as steps for forming through-holes, outer-layer printed circuits, etc.

As expedients for enabling inner-layer boards to have improved adhesive strength in multilayered printed boards, it is known that a copper foil both sides of which have been roughened beforehand is used, and that surface-roughening treatment of copper foil is conducted after an inner-layer board is manufactured and a printed circuit is formed thereon. Known techniques for the surface roughening treatment in the latter expedient include (1) a method in which the copper foil surface is treated with an oxidation-treated aqueous solution to form a finely roughened copper-oxide layer on the surface, (2) a method in which the copper foil surface is treated with a silane coupling agent, organotitanate coupling agent, or the like, and similar methods. Conventionally, however, inner-layer boards obtained by forming inner-layer printed circuits on copper-clad laminates having a glossy surface and then treating the copper foil surfaces with an oxidizing aqueous alkaline solution to form a finely roughened layer constituted by a brown to black copper oxide have usually been used from the standpoints of adhesiveness and economy.

However, this finely roughened layer constituted by a copper oxide, particularly copper(II) oxide is brittle and tends to dissolve in acidic aqueous solutions such as hydrochloric acid, sulfuric acid, and the like. Because of this, there has been a problem that in the case where multilayered boards produced by laminating using such copper foils are processed to form through-holes therein and then subjected to through-hole plating, electroless plating, or subsequent electroplating, the acidic solution gradually penetrates into the finely roughened copper-oxide layer from the layer's exposed parts in the through-hole walls and attacks the copper oxide layer to cause so-called "harrow" or "pink ring", which may impair insulating and other properties, resulting in final printed circuit boards with poor reliability.

As an expedient for preventing harrow or pink ring which is developed in multilayered boards using the copper foil having a finely roughened surface layer constituted by a brown to black copper oxide, (3) a method was recently disclosed in which the copper oxide constituting the finely roughened layer on the surface of the copper foil treated by method (1) above is reduced with an aqueous solution of a reducing agent, thereby to convert the copper oxide into cuprous oxide or copper metal (e.g., JP-A-56-153797). (The term "JP-A" as used herein means an "unexamined published Japanese patent application".) Although the copper foil treated by this method can still have practically acceptable adhesive strength, this method newly necessitates a liquid-phase reduction treatment step. Further, since the adhesive strength of the reduction-treated copper foil is lower than that of the copper foil having the finely roughened surface layer constituted by a brown to black copper oxide, it is necessary that the reduction conditions should be strictly regulated in order to obtain practically acceptable adhesive strength. In addition, the above method has been also defective in that the effect of preventing occurrence of "harrow" is not stably exhibited and the method has newly posed problems concerning the treatment of waste liquids resulting from the use of aqueous reducing agent solutions.

SUMMARY OF THE INVENTION

The present inventors conducted intensive investigations to overcome the above-described problems by reducing the brown to black copper oxide constituting the oxidation-treated, finely roughened copper-oxide layer on the surface of a copper foil in such a manner that the effect of preventing the occurrence of "harrow" is stably exhibited, the adhesive strength is not substantially impaired, and problems concerning waste liquid treatment are not newly posed.

As a result, the present inventors proposed to take gas-phase reduction as a theme of study. However, all the conventional processes for producing printed circuit boards each is based on use of water or an organic solvent solution, and there has been no example of use of a reducing gas in the production of printed circuit boards using fiber-reinforced resin laminates. Further, such gases are generally considered to be combustible and, in some cases, to cause explosion accidents. Because of these, it was extremely difficult to pursue the study of gas-phase reduction itself in which such a dangerous gas is handled Fortunately, however, a small-scale preliminary study showed the possibility that gas-phase reduction might be extremely useful Based on this, further studies have been conducted for practical use and, as a result, the present invention has been completed.

Accordingly, an object of the present invention is to provide a process for producing a multilayered printed circuit board substantially free from "harrow" or "pink ring".

According to one embodiment of the present invention, a process for producing a multilayered printed circuit board is provided which comprises using, as an intermediate layer, an inner-layer board obtained by chemically oxidizing the surface of a copper foil of an inner-layer board having a printed circuit formed in the copper foil, thereby to form on the surface a finely roughened layer constituted by a copper oxide of a brown to black color, and then reducing the copper oxide constituting the finely roughened layer in an atmosphere in which a reducing gas is present.

In preferred embodiments of the above process, the reducing gas is hydrogen, carbon monoxide, or a mixture thereof and the reduction is conducted at a temperature of from 100° to 160° C.; the reducing gas is hydrazine gas and the reduction is conducted at a hydrazine gas pressure (partial pressure) of from 0.01 to 15 mmHg and a temperature of from 60° to 140° C.; and a platinum group metal catalyst, particularly palladium (Pd), is fixed on the finely roughened copper-oxide layer.

According to another embodiment of the present invention, a process for producing a multilayered printed circuit board is provided which comprises chemically oxidizing the surface of a copper foil constituting an outermost layer of an inner-layer board having a printed circuit formed in the copper foil, thereby to form on the surface a finely roughened layer constituted by a copper oxide of a brown to black color, laminating the thus-treated inner-layer board as an intermediate layer with other laminating materials thereby to form a multilayered board, subjecting the multilayered board to the formation of through-holes, and thereafter reducing the copper oxide constituting the finely roughened layer on the copper foil in at least those parts of the inner-layer board which are close to the through-holes, the reduction being conducted during the period between the through-hole formation and electroless plating in an atmosphere in which a reducing gas is present.

In preferred embodiments of the above process, the treatment in an atmosphere in which a reducing gas is present is conducted during the period between desmear treatment and electroless plating; the reducing gas is hydrogen, carbon monoxide, a mixture thereof, or hydrazine gas; and a platinum group catalyst is fixed on walls of the through-holes.

DETAILED DESCRIPTION OF THE INVENTION

Laminating Materials

Figure 1:
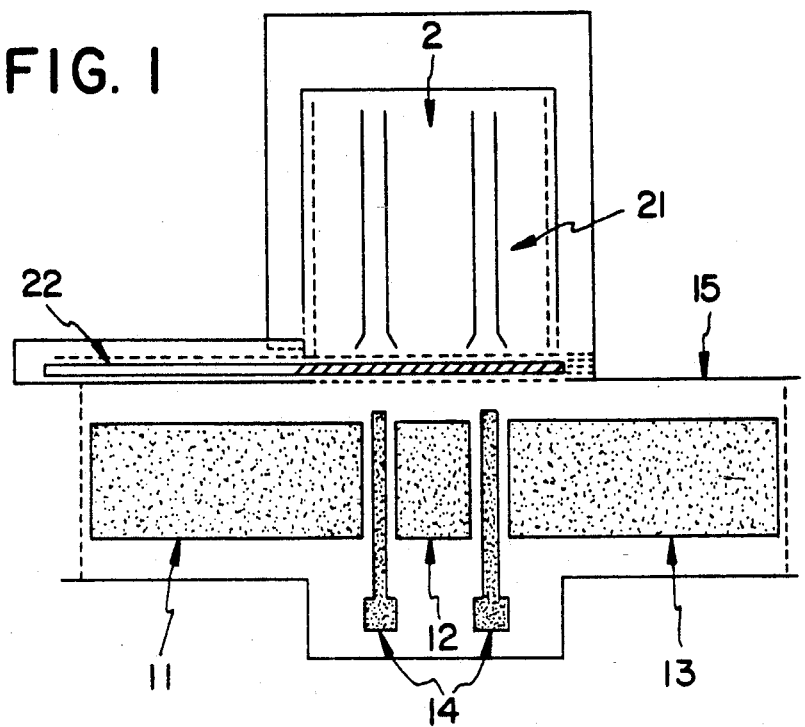
FIG. 1 is a diagrammatic view of one example of the flow part of an apparatus for batch reduction.

For producing a multilayered printed circuit board according to the process of the present invention, any of the conventionally known laminating materials including inner-layer boards for use in laminating for producing multilayered boards, prepregs for use in adhering in laminating for producing multilayered boards, prepregs for use in forming outer layers, copper foils, single-side copper-clad laminates, and the like and conventionally known laminating techniques can be used without any particular limitation, as long as an inner-layer board which has undergone gas-phase reduction is used or a multilayered board is subjected to gas-phase reduction after through-holes are formed therein.

Examples of such laminating materials include prepregs comprising reinforcing materials (i.e., base materials) and matrix resins.

Examples of the base materials include woven fabrics of various glasses such as E-glass, S-glass. SII-glass, D-glass, quarts glass, and the like and other inorganic woven fabrics such as alumina paper; woven fabrics made of super heat-resistant resins such as all-aromatic polyamides, polyimides, fluoroplastics, poly(phenylene sulfide), polyetheretherketones, polyetherimides, liquid-crystal polyester resins, and the like; woven fabrics obtained using composite yarns comprising combinations of fibers of the above inorganic materials and fibers of the above super heat-resistant resins; and other woven fabrics including those comprising suitable combinations of the above.

Examples of the matrix resins include epoxy resins such as the bisphenol A type, novolac type, halogenated bisphenol A type, and halogenated novolac type and other polyfunctional epoxy compounds having functionalities of 3 or more; cyanate ester-based resins such as cyanate resins, cyanate ester-epoxy resins, and cyanatic ester-maleimide-epoxy resins; maleimide-based resins obtained mainly from polyfunctional maleimides such as bismaleimide and polyfunctional amines such as bis(4-aminophenyl)methane; and heat-resistant thermoplastic resins and resins comprising blends of thermoplastic resins and thermosetting resins.

Examples of laminating materials further include copper foils such as electrolytic copper foils and rolled copper foils, double-side or single-side copper-clad laminates obtained from copper foils and prepregs by lamination molding, and printed circuit boards for inner-layer use (inner-layer boards) obtained by forming a printed circuit for inner-layer use on one or both sides of copper-clad laminates. Also usable as laminating materials are flexible copper-clad boards obtained by cladding a copper-foil to films or sheets made of super heat-resistant resins such as polyimides, fluoroplastics, poly(phenylene sulfide), polyetheretherketones, polyether-imides, liquid-crystal polyester resins, and others or to films or sheets made of heat-resistant thermoplastic resins or of blends of thermoplastic resins and thermosetting resins.

Examples of lamination molding techniques include conventional platen pressing, platen vacuum pressing, autoclave laminating, continuous pressing, and the like.

Brown or Black Oxidation Treatment of Inner-Layer Board

A method is known for converting the surface layer of a copper foil in an inner-layer board into a finely roughened layer of a brown to black copper oxide, i.e., a finely roughened layer in which submicron-order needles, wedges, axes, anchors, and the like comprising a copper oxide are densely present. Normally, this method comprises polishing or cleaning the surface of a copper foil of an inner-layer board, subsequently pre-etching (soft-etching or chemically polishing) the copper surface with an aqueous solution of a copper chloride, ammonium persulfate, or the like, and then oxidizing the resulting surface by treating it with an oxidizing aqueous alkaline solution Specific examples of such oxidizing aqueous alkaline solutions and treating conditions are as follows, but the treating solution and conditions for the oxidation treatment are not limited to these, and other known methods can be used.

(1) A solution containing sodium hydroxide (NaOH (15 g/l)), sodium hypochlorite (NaOCl (31 g/l)), and sodium phosphate (15 g/l); 70°–100° C., 0.5–10 min.

(2) A solution containing copper sulfate (50 g/l) and sodium chloride (200 g/l); 40°–80° C., 3–15 min.

(3) A solution containing acetic acid (20 g/l), ammonium chloride (20 g/l), and copper acetate (10 g/l); 30°–80° C., 1–10 min.

(4) A solution containing copper acetate (10 g/l), copper sulfate (24 g/l), barium sulfide (24 g/l), and ammonium chloride (24 g/l); 40°–50° C., 1–10 min.

(5) A solution containing copper sulfate (25 g/l), nickel sulfate (25 g/l), and potassium chlorate (25 g/l); 70°–90° C., 1–10 min.

(6) A solution containing potassium persulfate (20 g/l) and sodium hydroxide (50 g/l); 50°–80° C., 1–3 min.

Of the above-described methods for forming a finely roughened surface layer of a brown to black copper oxide, practically employed methods are carried out under such conditions to produce copper foils which show good adhesive strength when used in lamination molding for producing multilayered boards, with the finely roughened copper-oxide surface layer being as it is or after the copper oxide is reduced in a liquid phase.

However, since the copper foil having a finely roughened copper-oxide surface layer is used in the present invention after the copper oxide is reduced in a gas phase as being different from such conventional processes, it should be noted that the finely roughened copper-oxide surface layer which has the best surface state in terms of adhesive strength or which will have such best surface state after the copper oxide is reduced in a liquid phase does not necessarily have the best surface state even after gas-phase reduction. In other words, even in the case where the copper foil having a finely roughened copper-oxide surface layer is one in which the roughened surface layer is more coarse and brittle as compared with conventional ones and which therefore has poor adhesiveness or causes a trouble that when the copper foil and other laminating materials are laid up, part of the copper oxide falls from the copper foil and adheres to non-printed-circuit parts to foul the parts, these copper foils can be made free from such troubles and to have better adhesiveness by reducing the copper oxide to copper metal in a gas phase.

According to the process of the present invention, by fixing a platinum group metal catalyst on the finely roughened copper-oxide layer before reduction of the copper oxide, the reduction can be conducted at a lower temperature and the reduction rate can be increased. This method is advantageously used in the case where materials having slightly poor heat resistance are used or improvement in production efficiency predominates. Examples of the platinum group metal catalyst include ruthenium (Ru), rhodium (Rh), palladium (Pd), osmium (Os), iridium (Ir), and platinum (Pt). For fixing such a platinum group catalyst, the following methods can be employed: a method in which a salt or ammine complex salt of an inorganic or organic acid containing any of the above platinum group metals (examples of such compounds for palladium include palladium chloride, palladium acetate, palladium nitrate, dinitrotetramminepalladium, and the like) is dissolved in water or an organic solvent, and an inner-layer board to be treated is immersed in this solution, cleaned, and then dried; and a method in which such a treating solution is sprayed over an inner-layer board thereby to adhere the catalyst to the copper-oxide layer, and the resulting inner-layer board is cleaned and then dried. In the case of multilayered board in which through-holes have been formed, the above cleaning step can be omitted. The concentration of the treating solution is preferably in the range of from 0.001 to 1% by weight. After the inner-layer board is thus treated to sufficiently adhere the catalyst to the copper-oxide layer, the base plate preferably is cleaned by water-washing or other means to remove, as completely as possible, the platinum group metal catalyst adhered to the surfaces other than the copper oxide layer. The reasons for this are that use of an inner-layer board in which a platinum group catalyst remains in parts other than the printed circuit part is not preferred because this is apt to result in impaired electrical insulating properties and other troubles, and that the reducing gas to be used for reduction will be consumed by reactions other than the reduction.

Reducing Gas

The atmosphere in which a reducing gas is present and which is used in the gas-phase reduction according to the process of the present invention means a gas-phase atmosphere in which a reducing gas such as hydrogen or carbon monoxide, a gas of other gasifiable reducing compound, or the like is present, and such a reducing gas may suitably be diluted with a non-oxidizing gas.

Methods for feeding such a reducing gas are not particularly limited. Examples thereof include a method in which hydrogen gas or other gas is fed from a bomb, a method in which a gas is fed through electrolysis or catalytic pyrolysis, a method in which a gas is fed through gasification, and other methods.

Examples of compounds which can be used to generate a reducing gas such as hydrogen or carbon monoxide through catalytic pyrolysis include lower alcohols such as methanol, ethanol, propanol, and butanol; aldehydes and derivatives thereof such as formaldehyde, paraformaldehyde, and trioxane; lower carboxylic acids and esters thereof such as formic acid, its esters, and acetic acid; ammonia and hydrazine; nitrogen-containing lower amines and hydrazine derivatives such as methylamine, ethylamine, diethylamine, and methylhydrazine; metal hydrides and organometallic compounds such as calcium hydride, boron hydride, and methylboron; and the like.

Examples of reducing compounds which can be used after being gasified include hydrazine and its derivatives such as methylhydrazine and the like.

Of these, preferred compounds which generate reducing gases through catalytic pyrolysis are lower alcohols, lower carboxylic acids, and ammonia and a preferred reducing compound is hydrazine, from the standpoints of easy handling, safety on explosion or when exploded, cost, no generation of harmful wastes, etc.

For the method of feeding a reducing gas through catalytic pyrolysis, a commercially available apparatus can be used such as an apparatus for thermally decomposing ammonia. In the case where a reducing compound is fed in a gaseous state, examples of methods therefor include a method in which hydrazine is gasified by heating and this gas is fed after being mixed with a non-oxidizing gas, such as nitrogen, heated to a predetermined temperature; a method in which hydrazine is atomized into a non-oxidizing gas, such as nitrogen, heated to a predetermined temperature to thereby gasify the hydrazine, and the resulting gaseous mixture is fed as it is; a method in which while a non-oxidizing gas is kept being circulated through the inside and outside of the treating chamber, gasified or ungasified hydrazine is fed to the circulating gas; and the like.

Reduction Conditions

The temperature, treating time, and other conditions for the reduction are suitably selected according to the kind and amount (absolute or partial pressure) of the reducing gas used, the presence or absence of a platinum group metal catalyst on the copper-oxide layer, and other factors.

In the case of using a gas, such as hydrogen, which has a low reducing ability at room temperature, the treating temperature can be suitably selected from the range of from 80° to 300° C., preferably from 100° to 160° C., provided that the dimensional stability of the inner-layer board or holed multilayered board to be treated should be taken in account when determining the upper limit of the treating temperature, and the treating time can be suitably selected from the range of from 1 minute to 24 hours, preferably from 10 minutes to 3 hours. In the above case, it is preferred to fix a platinum group metal catalyst on the copper oxide layer to enable the reduction to conduct at a lower temperature and a higher rate. In the case of using a compound, such as hydrazine, which has a sufficient reducing ability even at room temperature, the treating temperature can be suitably selected from the range of normally from 160° C. to room temperature, preferably from 140° to 80° C., and the treating time from the range of from 30 seconds to 3 hours, preferably from 1 to 60 minutes, more preferably from 2 to 30 minutes. In this case also, the rate of reduction can be increased by fixing a platinum group metal catalyst on the copper oxide layer.

In particular, in the case of using hydrazine gas, there are cases where even though the atmosphere itself is gas-phase, the reduction reaction proceeds in a liquid film formed by the condensation of part of the hydrazine gas on the finely roughened copper-oxide surface layer or formed when water resulting from the reduction reaction remains on the surface without gasifying. Such liquid film formation is more apt to occur when the reduction reaction is conducted at a high rate. However, if such a liquid film is formed on the copper foil surface, migration of copper occurs and the finely roughened structure of the copper-oxide surface layer is destroyed and, as a result, the copper foil obtained through such reduction has poor adhesiveness. It is, therefore, preferred to regulate the partial pressure of hydrazine gas at a value as low as 50% or less, preferably 20% or less, more preferably 5% or less, of the saturated vapor pressure at the treating temperature, and to regulate the partial pressure of water vapor at a value as low as 50% or less, preferably 30% or less, more preferably 10% or less, of the saturated vapor pressure at the treating temperature. It is also preferable that blowing or agitation be conducted to promote gasification so as to prevent the water yielded by the reduction reaction from condensing to form a liquid film on the copper surface. A sufficient gas flow rate for this blowing or agitation is 0.01 m/sec or more, preferably 0.1 m/sec or more. Further, in the case of using hydrazine in particular, since a non-oxidizing gas is required to be used as a medium in a large quantity, it is particularly preferred to circulate the non-oxidizing gas after it is regenerated according to need. For circulation and reuse, it is particularly preferred to regulate the partial pressure of water vapor in the gas at 10 mmHg or less.

In conducting the above reduction, the degree of reduction can be selected in the range of from the completely reduced state to the half reduced state in which the copper(II) oxide has been mostly reduced into copper(I) oxide, by suitably selecting reduction conditions. Normally, however, it is preferred to conduct the reduction until the copper oxide is reduced into copper metal, from the standpoint of avoiding the occurrence of harrow or pink ring and from the standpoint of easy handling.

Post-Treatment after Reduction

The finely roughened surface layer in which the copper oxide has been thus reduced preferably to copper metal has finer roughness than the finely roughened copper-oxide surface layer. Because of the exceedingly large surface area of the especially finely roughened surface layer, the copper tends to be oxidized, so that the copper constituting the finely roughened surface layer is apt to be changed into a copper oxide during storage, etc., and this may result in an impaired adhesive strength.

Therefore, rust prevention treatment is preferably conducted to prevent oxidation and therefore permit easy storage. Although rust prevention treatment of the copper foil can be accomplished by a method in which immediately after the copper foil is taken out of the reducing chamber, the copper foil is treated with an aqueous solution of an ordinary rust preventive and then dried, gradual oxidation employing no liquid phase is particularly preferred as the post-treatment in the present invention. This gradual oxidation can be easily practiced by treating the copper foil by exposing it to an atmosphere normally having a partial oxygen pressure of several mmHg and a temperature of about 120° C. or more. Such an atmosphere is produced in the reducing chamber by removing, after the reduction, the remaining reducing gas substantially completely and then introducing a slight amount of oxygen before the temperature of the inner-layer board decreases.

Reduction Apparatus

Apparatuses for conducting the above-described gas-phase reduction are explained below.

It should first be noted that a reducing gas is handled which usually is unfamiliar in the fields of printed circuit boards where the present invention is involved. In this respect, the apparatus to be used should be designed so as to be free from inclusion of air into the reducing chamber (system) or gas leakage. It is also preferred to automatize the apparatus.

Handling of multilayered boards in which through-holes have been formed is extremely easy because they have no finely roughened copper-oxide layer on their surfaces.

On the other hand, in the case of inner-layer boards having a hard and brittle finely roughened layer constituted by a brown to black copper oxide (hereinafter, simply referred to as "inner-layer boards"), it is usually essential that they should be handled with the finely roughened copper-oxide layer being protected. It is necessary to keep the printed circuit surface of a printed circuit board away from other printed circuit boards, transporting means, devices, and other solid substances. In a preferred method for attaining this, an oxidation treatment rack for use in treating inner-layer boards of the currently most common type is used as it is or after being so modified that containment and withdrawal can be automated, and inner-layer boards are placed in the rack and subjected, while being kept in the rack, to oxidation treatment, gas-phase reduction, gradual oxidation as a post-treatment, and drying for lamination molding. The thus-treated inner-layer boards are combined with other laminating materials and subjected to lamination molding for producing multilayered boards. There is an attempt to make it possible to transport the finely roughened copper-oxide layer by rolls or other means, and if an inner-layer board having such an improved finely roughened copper-oxide layer has been obtained, such inner-layer boards can be handled in the same manner as in through-holed multilayered boards.

Reduction Flow

An apparatus for conducting the above-described gas-phase reduction basically comprises a reducing chamber, a reducing gas-feeding device (equipment), and an inert gas-feeding device or a treating device for circulation and reuse of an inert gas. If required and necessary, it further comprises, as auxiliary equipment, a waste gas-treating device, a device for feeding an inner-layer board or through-holed multilayered board to the reducing chamber and withdrawing it from the chamber, a control device for controlling these devices, and the like. The apparatus can be suitably designed for continuous, batch-continuous, or batch processing. The pressure for each processing step can be suitably selected from reduced, atmospheric, and elevated pressures, but atmospheric pressure is advantageous from the standpoint of easy operation.

An apparatus for batch processing basically comprises a reducing chamber, a reducing gas-feeding device, and an inert gas-feeding device, and it is suitably further provided with a pump for substitution and a vacuum pump which are for avoiding mixing of the reducing gas with air, a device for treating waste gas, etc. In batch processing, in which conducting the containment or withdrawal of boards in or from the reducing chamber one by one is disadvantageous from the standpoint of production efficiency, it is preferred that a plurality of inner-layer boards or through-holed multilayered boards be placed in a rack or the like and treated therein. The procedure for the reduction treatment basically comprises (1) introduction of inner-layer board into reducing chamber, (2) evacuation, (3) introduction of inert gas, (4) evacuation, (5) reduction by feeding inert gas containing reducing gas, (6) evacuation, (7) introduction of inert gas, (8) evacuation, (9) introduction of air, and (10) withdrawal of reduction-treated inner-layer board. In such procedure, steps (3), (4), (7), and (8) which are for conducting substitution through inert-gas introduction and evacuation can be omitted if the preceding evacuation has attained a sufficient vacuum, or these steps may be repeated one or more times. It is also possible to attain the desired substitution by only the feeding of an inert gas. It is preferred to add a step of gradually oxidizing the reduced copper surface, and this can be attained by conducting the air introduction (9) in a manner such that the temperature in the chamber after the reduction is kept, for example, at about 120° C., air is introduced in a small amount so as to result in an oxygen partial pressure of about several mmHg, and the boards being treated are kept in the chamber for a short period of time. Further, by employing sliding doors as the reducing chamber doors, providing the chamber with gas flow curtains which work when the doors are open, and further providing, if required and necessary, an auxiliary chamber for the introduction or withdrawal of boards, it becomes possible to minimize the gas outflow from and air inflow into the reducing chamber filled with a reducing gas-containing inert gas. Thus, the reduction treatment can be conducted at substantially atmospheric pressure only, substitution operations such as steps (2), (4), (6), and (8) for evacuation of the reducing chamber can be omitted from the second batch, and the consumed amount of inert gas can be reduced.

Batch-continuous processing for reduction can be conducted using an apparatus obtained by further providing the apparatus for the above batch processing with an introduction chamber for introducing inner-layer boards into the reducing chamber and a withdrawal chamber for withdrawing these from the reducing chamber. The procedure for the batch-continuous reduction treatment basically comprises (1) introduction of inner-layer board into introduction chamber, (2) evacuation of introduction chamber, (3) introduction of inert gas, (4) evacuation of reducing chamber, with the door between the introduction and reducing chambers and the door between the reducing and withdrawal chambers being open, (5) transportation of reduction-treated inner-layer board to withdrawal chamber and introduction of untreated inner-layer board into reducing chamber, (7) closing of reducing chamber doors, (8) introduction of reducing gas into reducing chamber, (9) evacuation of withdrawal chamber, (10) introduction of inert gas, (11) withdrawal of reduction-treated inner-layer board, (12) introduction of inner-layer board into introduction chamber, (13) evacuation of introduction chamber and withdrawal chamber, and (14) introduction of inert gas, followed by step (5). In the above procedure, the introduction or withdrawal of inner-layer boards or through-holed multilayered boards, substitution through evacuation and inert-gas introduction, gradual oxidation in the withdrawal chamber, and the like can be conducted by other means as in the case of the batch processing. Further, by employing sliding doors as the doors of the reducing chamber, introduction chamber, and withdrawal chamber, and providing these chambers with gas flow curtains which work when the doors are open, it becomes possible to minimize the outflow and inflow of gas between these chambers filled with an inert gas or a reducing gas-containing inert gas. Thus, the reduction treatment can be conducted at substantially atmospheric pressure, substitution operations (steps (2), (9), and (12)) for evacuation of the reducing chamber can be omitted from the second batch, and the consumed amount of inert gas can be reduced.

Continuous processing for reduction can be practiced using an apparatus which is basically the same as that for the above-described batch-continuous processing except that gas flow curtains for shielding are typically employed for producing the same effect as that obtained by the gas-substitution operations including door opening and closing in the batch-continuous processing. The apparatus comprises an introducing part, a gas flow curtain part, a reduction treatment chamber, a gas flow curtain part, and a withdrawing part arranged in series, throughout which a transporting device for inner-layer boards is provided.

In the case of inner-layer boards or through-holed multilayered boards which can be handled separately, mixing of a reducing gas with the air can be easily prevented by means of a gas flow curtain part comprising an inert gas-introducing part for introducing an inert gas pressurized to a value slightly higher than atmospheric pressure and slits provided on both sides of the inert gas-introducing part. As techniques or devices which perform a sealing function equal to that of the slits and inert gas-introducing part, the following can, for example, be mentioned: rolls and belts having surfaces which do not damage a finely roughened copper-oxide layer are used and they are revolved or moved at a speed equal to the traveling speed of copper foil; rolls and belts are made to be easily floated by means of a pressure difference as small as that produced by an introduced inert gas, by significantly reducing the weights of the rolls and belts and providing, at the edges thereof, a curtain which functions as a soft edge-dam; continuously porous rolls are used after their surface parts other than those to be in contact with or close to an inner-layer board or multilayered board are sealed, and blowing of an inert gas into the reducing chamber is conducted through the unsealed pores; and rolls in which their surface layer is made of an air bag or the like having an inner pressure about several mmHg higher than the atmospheric pressure are used.

In the case of inner-layer boards which cannot be handled separately, it is necessary to transport a plurality of inner-layer boards placed in a rack or the like. As a result, it becomes essential that, as compared with the case of inner-layer boards which can be handled separately, a greatly enlarged opening should be shielded by means of a gas flow curtain. It is preferred, for attaining such shielding, that the rack in which inner-layer boards have been vertically placed be kept vertical at least when it travels through the gas flow curtain-based shielding parts at the inlet and outlet of the reducing chamber, and that the gas flow curtain formed in each gas flow curtain part be constituted by at least three downward flows. In this case, the central flow is formed by feeding an inert gas and part of the central flow gas is recycled. Each of the other two flows on both sides of the central flow is constituted by part of the central flow and part of the recycled gas. Further, by allowing the reducing gas-containing gas in the reducing chamber and the gas in the introducing part to flow in the same direction as the flow of the inert gas constituting the inert gas flow curtain, the reducing chamber in the continuously processing apparatus can be sealed more perfectly. It is also preferable that by designing or modifying at least part of the blowing part for forming a gas flow curtain and of the parts adjacent to both sides of racks so as to be movable, the opening area in the gas flow curtain part be made controllable so as to keep the opening area minimal according to the width and height of racks passing through this gas flow curtain part. Furthermore, it is possible to produce an atmosphere in which the concentrations of a reducing gas and oxygen change continuously throughout the chamber, by providing the above-described gas flow curtains multistage-wise in respective sections in the chamber. This multistage-wise provision of gas flow curtains is preferred in that it enables control of the reduction reaction (in particular, to lower the initial rate of the reaction), rust prevention treatment by gradual oxidation, and other operations to be conducted simultaneously while the inner-layer boards are being treated continuously. With respect to the inlet of the introducing part and the outlet of the withdrawing part, a gas flow curtain constituted by a flow of air or other gas may be provided, by which the amount of the inert gas consumed by the inert gas flow curtain can be reduced In place of such a gas flow curtain or in combination with it, a plurality of doors which are opened and closed successively, a revolving door filled with an inert gas, or the like can be used, with the opening and closing of these doors being controlled according to transportation of inner-layer boards.

Examples of Flow

The flow parts of the above-described apparatuses for practicing the reduction flows are explained with reference to examples thereof.

Figure 2:
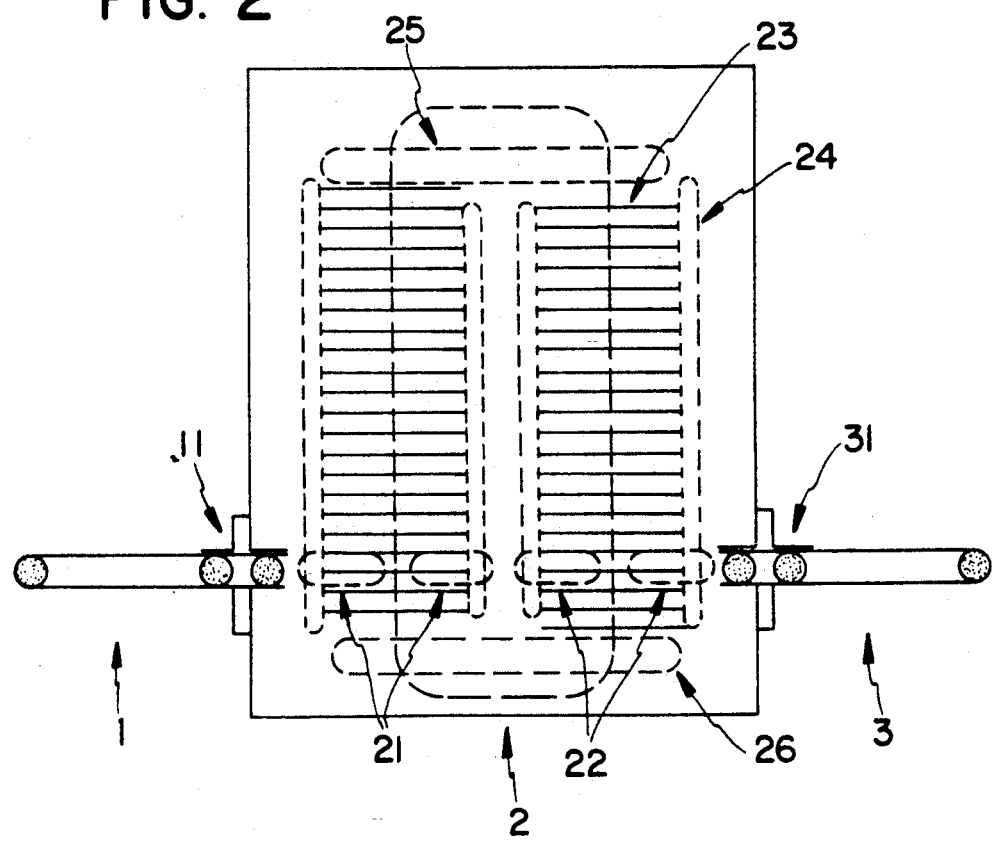
FIG. 2 is a diagrammatic view of one example of the flow part of an apparatus for the continuous reduction of inner-layer boards or holed multilayered boards which can to be treated separately.
Figure 3:
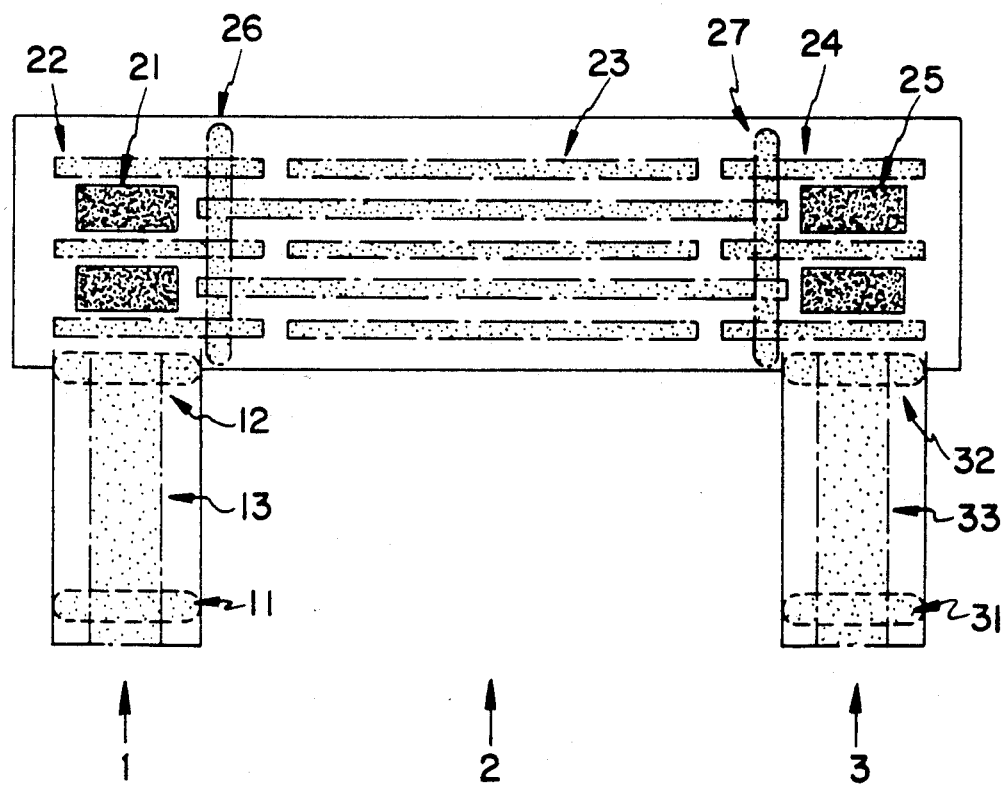
FIG. 3 is a diagrammatic view of one example of the flow part of an apparatus for the continuous reduction of a plurality of inner-layer boards placed in a rack, etc.
Figure 4:
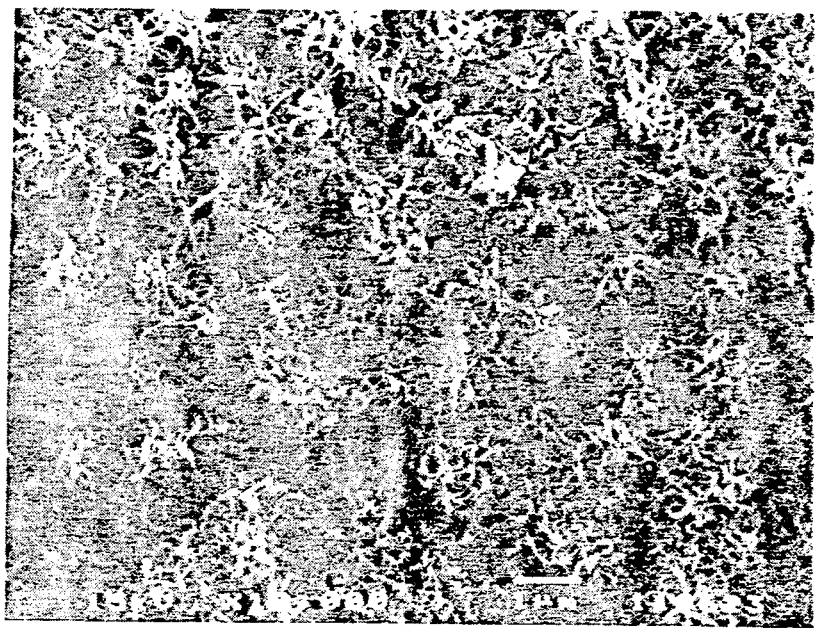
FIGS. 4, 5, 6 and 7 each is a scanning electron micrograph showing the state of copper foil surfaces before and after reduction treatment.
Figure 5:
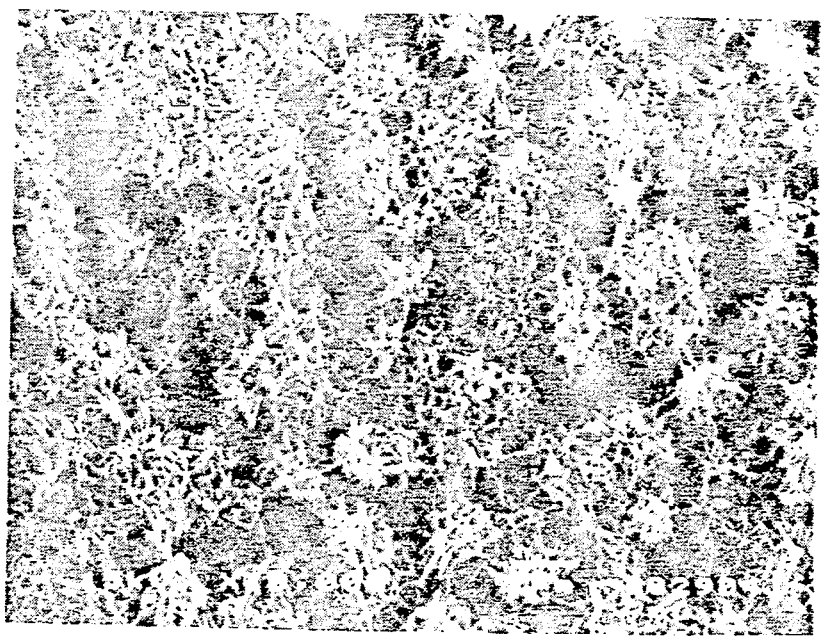
Figure 6:
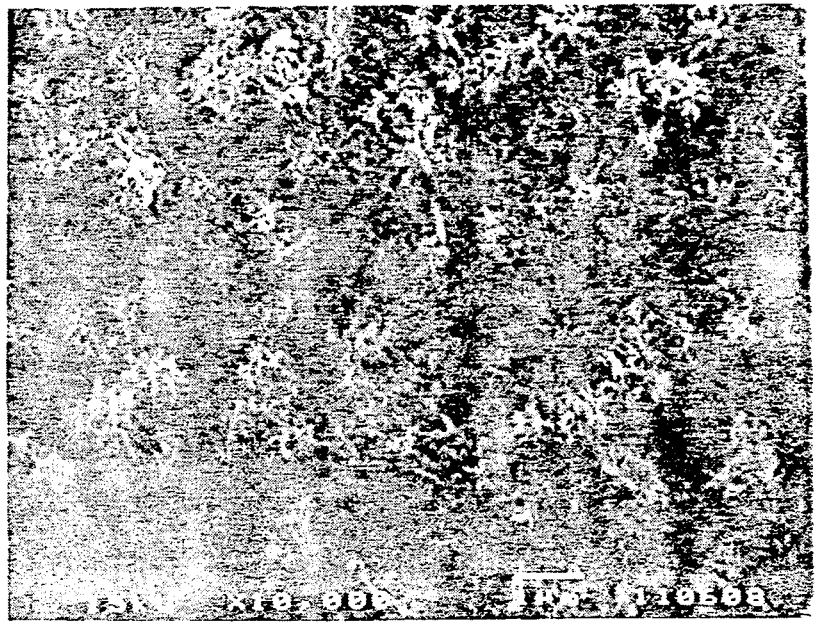
Figure 7:
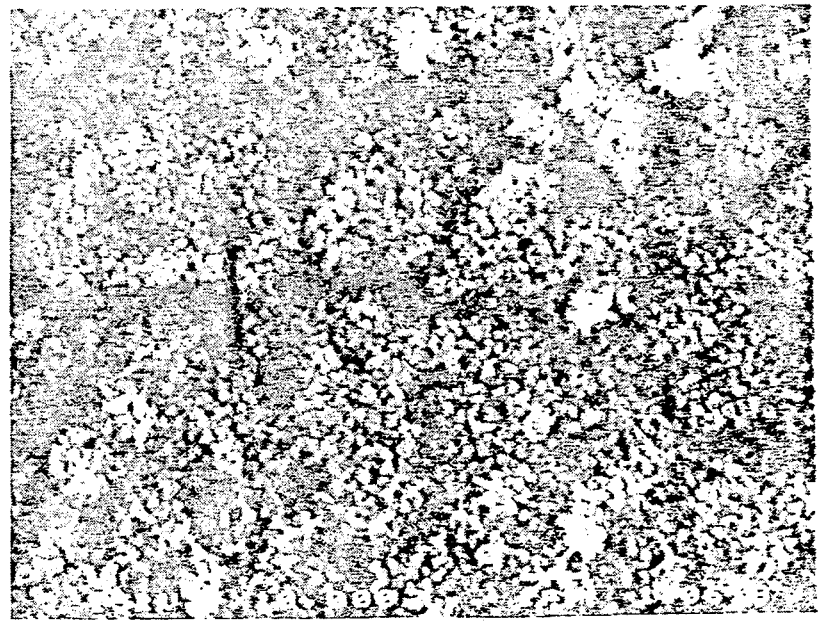

FIG. 1 illustrates one example of the flow part of an apparatus for batch reduction. FIG. 2 illustrates one example of the flow part of an apparatus for the continuous reduction of inner-layer boards or holed multilayered boards which can be treated separately. FIG. 3 illustrates one example of the flow part of an apparatus for the continuous reduction of a plurality of inner-layer boards placed in a rack, etc.

With reference to FIG. 1, an example of reduction flow is explained. Two or more racks containing, placed therein, a plurality of inner-layer boards in each of which a finely roughened copper-oxide layer has been formed on the printed-circuit copper foil surface and which have been dried are placed on a transporting belt 11 and then transported onto an introducing and withdrawing lift 14. Subsequently, the racks are introduced into a reducing chamber 2 with the lift 14, which then returns to its original position A door 22 of the reducing chamber 2 is closed while nitrogen gas is kept being introduced into the chamber. Before the reduction is completed, racks containing inner-layer boards to be reduction-treated next are placed on the transporting belt 11. After completion of the reduction, the door 22 of the reducing chamber 2 is opened, and the racks containing the reduction-treated inner-layer boards are taken out of the reducing chamber 2 with the lift 14 and then moved to the right-side end by means of a central transporting belt 12 and a withdrawing and transporting belt 13. Subsequently, the racks which have been placed on the transporting belt 11 are introduced into the reducing chamber in the same manner as the above to conduct reduction reaction. In the apparatus shown in FIG. 1, a gas curtain formed by a flow of nitrogen gas or other gas can be provided at the reducing chamber door 22, and a gas curtain formed by a flow of nitrogen gas or other gas, a door for simplified shielding, or the like can be provided, for example, on those parts of the transporting belts 11 and 13 which are located in front of both side edges of the reducing chamber door.

With reference to FIG. 2, another example of reduction flow is explained. An inner-layer board in which a finely roughened copper-oxide layer has been formed on the copper foil surface and which has been dried is fed to an introduction table 1. This inner-layer board passes through an introduction part orifice seal 11 and is introduced into a predetermined position by means of introducing belts 21 provided in the left-side part of a reducing chamber 2. The inner-layer board is then lifted by an ascending-and-descending type transporting frame 23 which has been ascending. In the upper part of the reducing chamber, the ascending-and-descending type transporting frame 23 is fixed, by an electromagnet or other means, to an upper transporting means 25 for transporting frames horizontally, and is then transported to the right until it reaches a transporting frame guide 24. Then, the transporting frame 23 is separated from the transporting means 25 and descends. The inner-layer board on the frame thus descends and is then received by withdrawing belts 22. The inner-layer board is sent to the right, passes through a withdrawal part orifice seal 31, and is then withdrawn from a withdrawal table 3. The apparatus as shown in FIG. 2 has been designed so as to be advantageously applicable to the treatment of inner-layer boards or the like which require relatively long reduction times and, in particular, have small thicknesses. In the case where a short reduction time can be used, it is, of course, possible to reduce the number of ascending-and-descending type transporting frames, or to replace the transporting means comprising these transporting frames with mere transporting belts. In the case of relatively stiff inner-layer boards, it is, of course, possible to employ the technique of treating these boards while they are kept being leaned, as in the steps of drying, curing, etc., in the manufacture of rigid printed circuit boards.

With reference to FIG. 3, a further example of reduction flow is explained Racks containing, placed therein, a plurality of inner-layer boards in each of which a finely roughened copper-oxide layer has been formed on the printed-circuit copper foil surface and which have been dried are continuously fed, at predetermined intervals, onto an introducing belt 13 in an introduction part 1. This introduction part 1 is equipped, at its inlet, with an air curtain 11 formed by a flow of air or a mixture of air and a non-oxidizing gas, and further equipped, at its outlet, i.e., at the opening near the inlet of a reducing chamber 2, with a gas curtain 12 formed by a flow of a non-oxidizing gas. Thus, the inflow of air into the reducing chamber 2 and the outflow of a reducing gas from the reducing chamber 2 are prevented. The rack is transported from the introduction part 1 onto introducing rolls 21, and then sent from transporting belts 22 through a gas curtain 26 to transporting belts 23 in the reducing chamber. After completion of reduction reaction, the resulting rack is sent from the transporting belts 23 in the reducing chamber to transporting belts 24 and then onto withdrawing rolls 25, which transport the rack to a withdrawing belt 33. The rack then passes through a gas curtain 32 and an air curtain 31 both in a withdrawal part, and is then withdrawn. In the above-described apparatus, the transfers of the rack from the introducing rolls 21 to the transporting belts 22, from the transporting belts 22 to the transporting belts 23, from the transporting belts 23 to the transporting belts 24, and from the transporting belts 24 to the withdrawing rolls 25 are conducted by moving the transporting belts 22 and the transporting belts 24 upward or downward.

Advantages of the Reduction

The gas-phase reduction as described above is conducted under conditions which are substantially the same as those for drying, except that a reducing gas atmosphere is used. Therefore, if the above-described gas-phase reduction is applied to the treatment of inner-layer boards just after oxidation treatment, at least part of the drying step which is conducted after the oxidizing step can be replaced with the reducing step. Thus, the treating process becomes extremely rational.

Further, the above-described gas-phase reduction is substantially free from the problems concerning waste liquid treatment as in the liquid-phase reduction. For example, in the case where a toxic gas such as carbon monoxide is used in the waste gas, it is sufficient that the waste gas discharged from the reducing apparatus is introduced into a catalytic combustor, where the reducing gas remaining unreacted is converted to carbon dioxide or water according to the starting reducing gas. In the case of hydrazine, removal or recovery of hydrazine from the waste gas can be easily attained through condensation by cooling, absorption by water, etc., and the recovered hydrazine is reusable.

From the standpoints of safety and others, the smaller the amount of combustible or explosive gases handled or stored, the better Fortunately, the amount of a reducing gas needed for the gas-phase reduction described above is extremely small as compared with those of ordinarily used industrial gases. Illustratively stated, assuming that a finely roughened copper-oxide layer having an average thickness of 2 $\mu$m, which is an excessively large evaluation, and having an area of 5,000 m$^2$ is treated, the amount of the reducing gas required is about 18 Nm$^3$ in the case of hydrogen. In the case of through-hole treatment, the amount of the reducing gas required is at the most about 1/100 the above calculated amount. Therefore, there is no need of stocking a large quantity of gas, and feeding of a reducing gas can be very easily accomplished, for example, by means of a commercially available hydrogen-evolving device which on-site generates a required amount of hydrogen through the decomposition of ammonia. This reducing gas-feeding method is preferred. In the case of hydrazine, hydrazine hydrate can also be used advantageously. Further, in a reducing system in which hydrazine hydrate is present at a partial pressure of 0.01 mmHg or more, preferably in the range of from 0.1 to 15 mmHg, the reduction reaction can be completed within a practical period of time. This means that the reducing atmosphere can be produced by merely mixing such a small amount of hydrazine gas, for example, with nitrogen gas having atmospheric pressure. Therefore, the partial pressure of hydrazine gas is far below the explosion limit, so that the reduction can be carried out under conditions which do not cause an explosion even if gas leakage occurs.

Post-Treatment and Surface State Before and After Reduction

Usually, the inner-layer board which has undergone gas-phase reduction according to the method described above is used as it is in lamination molding to produce a multilayered shielded board having a copper foil on both sides. This multilayered board is processed, for example, by subjecting it to drilling, polishing, desmear treatment, electroless plating, and electroplating, followed by formation of a printed circuit pattern on both surfaces, thereby giving a multilayered printed circuit board free from harrow. If multilayered printed circuit boards develop "harrow" even though they employ the inner-layer board in which the copper oxide constituting the finely roughened surface layer has been reduced to copper metal by the above-described gas-phase reduction, the main cause of the occurrence of harrow should be inadequate conditions for lamination molding, drilling, etc. In particular, there is a fair possibility that a defect in the prepregs used in the lamination molding, specifically, moisture absorption, etc., is the cause.

Holed multilayered boards which have undergone the gas-phase reduction treatment are processed, for example, by subjecting these to through-hole plating and formation of a printed circuit pattern on both surfaces, thereby giving multilayered printed circuit boards.

Finally, the effects of the gas-phase reduction described above which are brought about when the reduction is applied to inner-layer boards are explained by reference to the scanning electron micrographs I to IV shown in FIGS. 4 to 7, respectively.

Photograph I

Surface of finely roughened copper-oxide layer.

Photograph II

Surface of finely roughened layer which has undergone hydrogen reduction treatment.

Conditions: 180° C., 3 hr, atmospheric pressure, hydrogen gas 100%.

Photograph III

Surface of finely roughened layer which has undergone hydrazine reduction treatment.

Conditions: 120° C., 30 min, atmospheric pressure, gas flow 0.085 m/sec, $N_2H_4 \cdot H_2O$ concentration in nitrogen gas 0.15 vol %.

Photograph IV

Surface of finely roughened layer which has undergone hydrazine reduction treatment in which a liquid film is presumed to have been formed on the surface.

Conditions 40° C., 30 min, atmospheric pressure, gas flow 0.085 m/sec, $N_2H_4 \cdot H_2O$ concentration in nitrogen gas 0.34 vol %, water 0.7 vol %.

Scanning electron micrograph I described above shows that the finely roughened copper-oxide layer is in the state in which copper-oxide projections in the shape of submicron-order or smaller needles, short fibers, whiskers, or wedges are densely present. The gas-phase reduction of this copper oxide into copper metal gives the finely roughened layer as shown in photographs II and III. Although the projections in the finely roughened layer after the reduction (photographs II and III) seem to have become little more slender, such a change cannot substantially be recognized at a glance. In the above-described gas-phase reduction, the finely roughened copper-oxide layer can be converted to a finely roughened layer of copper metal having greatly enhanced strength and toughness and in which the roughness has contracted by a degree corresponding to the elimination of oxygen, while the finely roughened state of the copper-oxide layer being maintained substantially unchanged. It can be understood from the above that even in the case of a copper foil having a finely roughened copper-oxide surface layer which has a large roughness and is brittle as compared with conventional ones and, hence, shows poor adhesiveness, it can be made advantageously usable by reducing the copper oxide into copper metal to thereby increase the adhesiveness.

From scanning electron micrograph IV, it can also be understood that under conditions which result in formation of a liquid film or the like on the copper surface (e.g., high-rate reduction at a relatively low temperature or reduction using a gas flow that is too low for the reduction rate), the finely roughened state of the copper-oxide layer is destroyed and accumulation of fine particles and the like occur and, as a result, the resulting copper foil has severely impaired adhesiveness.

Effects of the Invention

As described above and as will be demonstrated by the examples given below, multilayered printed circuit boards produced by the process of the present invention are substantially or completely free from occurrence of "harrow", which are formed by the dissolution of a brown to black copper oxide into a plating solution during the through-hole plating step where an electrical current is passed between printed circuits in multilayered boards, and which are prone to cause defects such as electrical short-circuits.

In the case of inner-layer boards, since a conventional drying step can be conducted during the gas-phase reduction treatment of inner layer boards, modification of an existing inner-layer board-treating line is not so costly. To scale up the treating line is also extremely easy because the reduction is conducted in a gas phase.

Moreover, since the reducing gas used in the gas-phase reduction can be obtained by catalytic pyrolysis, there is no need of stocking a combustible or even explosive gas in a large quantity. A further advantage of the gas-phase reduction treatment is that the process itself causes no environmental pollution because the wastes resulting from the reduction treatment are gaseous and the reducing gas remaining unreacted after the treatment can be very easily removed by catalytic combustion or other means. Use of hydrazine gas is advantageous in that a low hydrazine gas concentration is sufficient for the reduction treatment and, hence, the gas can be used at a concentration below the explosion limit, and that the process itself causes no environmental pollution because the wastes resulting from the reduction treatment are gaseous and the reducing gas remaining unreacted after the treatment can be very easily removed by catalytic combustion or other means.

Furthermore, the surface state of the copper foil which underwent the above-described gas-phase reduction treatment and in which the reduction of copper oxide into copper metal has been ascertained by X-ray fluororescence spectroscopy (It was impossible to ascertain with conventional X-ray diffraction or IR analysis is almost the same as that of the oxidation-treated copper foil before the reduction treatment, according to surface examination with a microscope or scanning electron microscope. However, if the gas-phase reduction-treated surface is compared carefully with the copper foil surface which has undergone only the oxidation treatment for bonding, the projections on the former surface are found to have become slightly slender. This fact supports the exceedingly good properties, including enhanced adhesive strength, of the multilayered printed circuit boards obtained by the present invention.

To sum up, according to the process of the present invention, multilayered printed circuit boards having excellent reliability can be produced at a high efficiency without causing environmental pollutions. Therefore, the process is of considerable industrial significance.

EXAMPLES

The present invention is explained in more detail by reference to the following examples, which should not be construed as limiting the scope of the invention.

EXAMPLE 1

The copper foil on both sides of a 0.8 mm-thick double-side copper-clad glass-epoxy laminate having a copper foil thickness of 70 μm was removed by a conventional etching technique to form striped patterns with copper foil portions each stripe having a width of 10 mm. The resulting laminate was treated at 90° C. for 5 minutes with a conventionally known aqueous solution of 15 g/l NaOH, 31 g/l sodium hypochlorate, and 15 g/l sodium phosphate to conduct black oxidation treatment of the copper foil surfaces. The laminate was then washed with water, thereby obtaining a black oxidation-treated inner-layer board.

The black oxidation-treated inner-layer board was placed in a drying chamber capable of being evacuated, and dried at 130° C. for 30 minutes under atmospheric pressure. Subsequently, while the temperature was kept being regulated at the value as shown in Table 1 under "Reduction Conditions", the drying chamber was evacuated, dried nitrogen gas was introduced thereinto to return the chamber to atmospheric pressure, the chamber was evacuated again, and then nitrogen gas containing hydrazine at the hydrazine partial pressure as shown in Table 1 under "Reduction Conditions" was fed thereby to conduct reduction treatment. Thereafter, the reduction-treated inner-layer board was taken out of the drying chamber.

The above-obtained inner-layer board was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm$^2$ for 2 hours, thereby obtaining a four-layer board.

Using part of the thus-obtained four-layer board, the peel strength of the inner-layer copper foils was measured.

With respect to the remaining part of the four-layer board, drilling was conducted under conditions of hole diameter 0.4 mm, 80,000 r.p.m., and 20 μm per revolution. The drilled four-layer board was immersed in 4N hydrochloric acid for 5 minutes, and then arbitrary one fourth (125) of all the holes were examined for harrow in hole-surrounding parts under which an inner-layer copper foil was present. Further, the length of the largest harrow was measured. The results obtained are shown in Table 1.

TABLE 1

| | Test No. | | | | | |
|---|---|---|---|---|---|---|
| | 1 | 2 | 3 | 4 | 5 | 6 |
| Reduction Conditions | | | | | | |
| Temperature (°C.) | 60 | 60 | 100 | 120 | 120 | |
| Time (min) | 40 | 50 | 30 | 30 | 15 | None |
| N$_2$H$_4$ pressure (mmHg) | 1.0 | 3.0 | 3.0 | 1.0 | 2.5 | |

TABLE 1-continued

| | Test No. | | | | | |
|---|---|---|---|---|---|---|
| | 1 | 2 | 3 | 4 | 5 | 6 |
| Reduced State of Copper Foil Surface | Cu$_2$O | Cu | Cu | Cu | Cu | CuO |
| Peel Strength of Inner Layer (kg/cm) | 1.0–1.1 | 0.9–1.0 | 1.1–1.2 | 0.9–1.0 | 1.1–1.2 | 1.3–1.4 |
| Harrowing (μm) | 118 | <30 | <30 | <30 | <30 | 300 |

In Table 1, "harrowing of 30 μm or less" indicates that occurrence of harrowing was not observed.
Test Nos. 1–5: Invention
Test No. 6: Comparison
Total pressure of reduction treatment: Atmospheric pressure

EXAMPLE 2

Black oxidation-treated inner-layer boards were obtained in the same manner as in Example 1.

These black oxidation-treated inner-layer boards were treated by immersing them at room temperature for 2 minutes in a 0.05%, 0.1%, or 0.25% acetone solution of palladium acetate or in a 0.25% aqueous solution of rhodium chloride, and then washed with water. Thus, inner-layer boards on which a platinum group catalyst had been fixed were obtained.

Each of the thus-treated inner-layer boards was placed in a drying chamber capable of being evacuated, and dried at 130° C. for 10 minutes under atmospheric pressure. Subsequently, the temperature was kept being regulated at the value as shown in Table 2 under "Treating Temperature", the drying chamber was evacuated, nitrogen gas was introduced thereinto, the chamber was evacuated again, and then hydrogen gas was introduced thereby to conduct reduction treatment. Thereafter, the drying chamber was evacuated, nitrogen gas was introduced thereinto, and then the reduction-treated inner-layer board was taken out of the drying chamber.

Thus, several inner-layer boards which had undergone reduction treatment at respective treating temperatures for respective treating times were obtained. These inner-layer boards were examined for color change of the black oxidation-treated copper foil surface and to determine the reduced state of the copper foil surface. The results obtained are shown in Table 2.

Each of the above-obtained inner-layer boards in various reduced states was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm$^2$ for 2 hours to obtain a four-layer board, which was then cooled.

The thus-obtained four-layer boards were evaluated in the same manner as in Example 1. The results obtained are shown in Table 2.

TABLE 2

| | Test No. | | | | | |
|---|---|---|---|---|---|---|
| | 1 | 2 | 3 | 4 | 5 | 6 |
| Catalytic Component | Pb | Pb | Pb | Rh | None | None |
| Concentration (%) | 0.05 | 0.10 | 0.25 | 0.25 | | |
| Treating | 140 | 120 | 120 | 150 | 170 | |

TABLE 2-continued

| | Test No. | | | | | |
|---|---|---|---|---|---|---|
| | 1 | 2 | 3 | 4 | 5 | 6 |
| temperature (°C) | | | | | | |
| Treating time (min) | 60 | 30 | 60 | 60 | 60 | None |
| H$_2$ concentration (%) | 100 | 100 | 30 | 100 | 100 | |
| Color of Copper Foil Surface | Light brown | Light brown | Light brown to brown | Light brown to brown | Blackish brown | Black |
| Reduced State | Cu | Cu | Cu | Cu | Cu$_2$O | CuO |
| Peel Strength of Inner Layer (kg/cm) | 1.0–1.1 | 1.0–1.1 | 1.0–1.1 | 0.9–1.0 | 1.1–1.2 | 1.3–1.4 |
| Harrowing (μm) | <30 | <30 | <30 | <30 | 100 or less | 300 or less |

Test Nos. 1–4: Invention
Test Nos. 5–6: Comparison
Total pressure of reduction treatment: Atmospheric pressure

EXAMPLE 3

Black oxidation-treated inner-layer boards were obtained in the same manner as in Example 1.

Each of the black oxidation-treated inner-layer boards was placed in a drying chamber capable of being evacuated, and dried at 130° C. for 10 minutes under atmospheric pressure. Subsequently, while the temperature was kept being raised to the value as shown in Table 3 under "Reduction Conditions", the drying chamber was evacuated, nitrogen gas was introduced thereinto, the chamber was evacuated again, and then hydrogen gas was introduced thereby to conduct reduction treatment. Thereafter, the drying chamber was evacuated, nitrogen gas was introduced thereinto, and then the reduction-treated inner-layer board was taken out of the drying chamber.

Thus, several inner-layer boards which had undergone reduction treatment at respective treating temperatures for respective treating times were obtained. These inner-layer boards were examined for color change of the black oxidation-treated copper foil surface and to determine the reduced state of the copper foil surface. The results obtained are shown in Table 3.

Each of the above-obtained inner-layer boards in various reduced states was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm² for 2 hours to obtain a four-layer board, which was then cooled.

The thus-obtained four-layer boards were evaluated in the same manner as in Example 1. The results obtained are shown in Table 3.

TABLE 3

| | Test No. | | | | |
|---|---|---|---|---|---|
| | 1 | 2 | 3 | 4 | 5 |
| Reduction Conditions | | | | | |
| Temperature (°C.) | 200 | 175 | 175 | 150 | |
| Time (min) | 45 | 180 | 45 | 600 | None |
| H$_2$ concentration | 50 | 50 | 50 | 50 | |
| Surface State of Copper Foil | | | | | |
| Color | Light brown | Light brown to brown | Blackish brown | Light brown to brown | Black |
| Reduced state | Cu | Cu | Cu$_2$O | Cu | CuO |
| Peel Strength of Inner Layer (kg/cm) | 1.0–1.1 | 1.0–1.1 | 1.3–1.4 | 1.1–1.2 | 1.3–1.4 |
| Harrowing (μm) | <30 | <30 | 166 | <30 | 300 or less |

Test Nos. 1–4: Invention
Test No. 5: Comparison
Total pressure of reduction treatment: Atmospheric pressure

EXAMPLE 4

Black oxidation-treated inner-layer boards were obtained in the same manner as in Example 1 and dried at 130° C. for 30 minutes under atmospheric pressure. The resulting black oxidation-treated inner-layer boards were subjected to gas-phase reduction under the conditions for Tests Nos. 2 to 5 in Example 1.

Each of the above-obtained inner-layer boards was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm² for 2 hours to obtain a four-layer board, which was then cooled.

With respect to each of the thus-obtained double-side copper-clad laminates, drilling was conducted to form 1,000 holes at intervals of 2.54 mm under conditions of hole diameter 0.4 mm, 80,000 r.p.m., and 20 μm per revolution.

The holed multilayered shielded boards were subjected to desmear treatment and then to gas-phase reduction treatment under the same conditions as in Example 1. Thereafter, ordinary through-hole copper plating was conducted, and the resulting multilayered boards were examined for harrow.

As a result, no harrowing was observed.

EXAMPLE 5

Black oxidation-treated inner-layer boards were obtained in the same manner as in Example 1.

Each of the inner-layer boards was placed in a drying chamber capable of being evacuated, and dried at 130° C. for 30 minutes under atmospheric pressure. Subsequently, the resulting inner-layer board was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm² for 2 hours to obtain a four-layer board, which was then cooled.

With respect to each of the thus-obtained four-layer boards, drilling was conducted to form 10,000 holes at intervals of 2.54 mm under conditions of hole diameter 0.4 mm, 80,000 r.p.m., and 20 μm per revolution. The holed multilayered shielded boards were subjected to desmear treatment and then to reduction treatment under the conditions as shown in Table 4.

The thus-treated multilayered boards were examined for harrow in the same manner as in Example 1. The results obtained are shown in Table 4.

TABLE 4

|  | Test No. | | | | |
| --- | --- | --- | --- | --- | --- |
|  | 1 | 2 | 3 | 4 | 5 |
| Reduction Conditions | | | | | |
| Temperature (°C.) | 60 | 60 | 100 | 80 | |
| Time (min) | 15 | 30 | 10 | 10 | None |
| $N_2H_4$ pressure (mmHg) | 1.0 | 2.0 | 2.0 | 3.0 | |
| Harrowing (μm) | 70 | <30 | <30 | <30 | 300 |

Test Nos. 1–4: Invention
Test No. 5: Comparison
Total pressure of reduction treatment: Atmospheric pressure

EXAMPLE 6

Black oxidation-treated inner-layer boards were obtained in the same manner as in Example 1 and dried at 130° C. for 30 minutes under atmospheric pressure.

Each of the above-obtained inner-layer boards was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm² for 2 hours to obtain a four-layer board, which was then cooled.

With respect to each of the thus-obtained double-side copper-clad laminates, drilling was conducted to form 1,000 holes at intervals of 2.54 mm under conditions of hole diameter 0.4 mm, 80,000 r.p.m., and 20 μm per revolution.

The holed multilayered shielded boards were subjected to desmear treatment, and then further subjected to catalyst fixation and gas-phase reduction treatment under the same conditions as in Tests Nos. 1 to 4 in Example 2. Thereafter, ordinary through-hole copper plating was conducted, and the resulting multilayered boards were examined for harrow.

As a result, no harrowing was observed.

EXAMPLE 7

On both sides of a 0.8 mm-thick double-side copper-clad glass-epoxy laminate having a copper foil thickness of 70 μm, model patterns having land diameters of 2.0 mm, 1.5 mm, 1.0 mm, and 0.8 mm were formed by a known etching technique. The resulting laminate was treated at 90° C. for 5 minutes with a conventionally known aqueous solution of 15 g/l NaOH, 31 g/l sodium hypochlorate, and 15 g/l sodium phosphate to conduct black oxidation treatment of the copper foil surfaces. The laminate was then washed with water, thereby obtaining a black oxidation-treated inner-layer board.

The black oxidation-treated inner-layer board was placed in a drying chamber capable of being evacuated, and dried at 130° C. for 30 minutes under atmospheric pressure. Subsequently, while the temperature was kept at 120° C., the drying chamber was evacuated, dried nitrogen gas was introduced thereinto, the chamber was evacuated again, and then nitrogen gas containing hydrazine at a hydrazine partial pressure of 3 mmHg was fed thereby to conduct reduction treatment. Thereafter, the reduction-treated inner-layer board was taken out of the drying chamber.

The above-obtained inner-layer board was sandwiched between three sheets of glass-epoxy prepreg (resin content 52%, thickness 0.1 mm) and three sheets of the same prepreg, and the superposed materials were further sandwiched between two sheets of electrolytic copper foil having a thickness of 18 μm. The resulting assembly was subjected to lamination molding at a temperature of 175° C. and a pressure of 40 kg/cm² for 2 hours, thereby obtaining a four-layer board.

Using this four-layer board, drilling was conducted at predetermined positions under conditions of hole diameter 0.4 mm, 80,000 r.p.m., and 20 μm per revolution. Subsequently, through-hole plating was conducted in an ordinary manner and a circuit pattern was formed in both outer layers by a known method.

After the copper foils constituting both outer layers in the above four-layer board were removed, all the holes were examined for harrowing. As a result, the harrow lengths were 30 μm or less for each land diameter and, thus, substantially no harrowing was observed.

While the invention has been described in detail and with reference to specific embodiments thereof, it will be apparent to one skilled in the art that various changes and modifications can be made therein without departing from the spirit and scope thereof.

What is claimed is:

1. A process for producing a multilayered printed circuit board which comprises using, as an intermediate layer, an inner-layer board obtained by chemically oxidizing the surface of a copper foil constituting an outermost layer of an inner-layer board having a printed circuit formed in the copper foil, thereby to form on the surface a finely roughened layer constituted by a copper oxide of a brown to black color, and then reducing the copper oxide constituting the finely roughened layer in an atmosphere in which a reducing gas is present.

2. A process as claimed in claim 1, wherein said reducing gas is hydrogen, carbon monoxide, or a mixture thereof.

3. A process as claimed in claim 2, wherein the reduction is conducted at a temperature of from 100° to 160° C.

4. A process as claimed in claim 1, wherein said reducing gas is hydrazine gas.

5. A process as claimed in claim 4, wherein the pressure of said hydrazine gas is from 0.01 to 15 mmHg.

6. A process as claimed in claim 5, wherein the reduction is conducted at a temperature of from 60° to 140° C.

7. A process as claimed in claim 1, wherein a platinum group metal catalyst is fixed on the finely roughened layer constituted by a copper oxide.

8. A process as claimed in claim 7, wherein said platinum group metal catalyst is palladium (Pd).

9. A process for producing a multilayered printed circuit board which comprises chemically oxidizing the surface of a copper foil constituting an outermost layer of an inner-layer board having a printed circuit formed in the copper foil, thereby to form on the surface a finely roughened layer constituted by a copper oxide of a brown to black color, laminating the thus-treated inner-layer board as an intermediate layer with other laminating materials thereby to form a multilayered board, subjecting the multilayered board to the formation of through-holes, and thereafter reducing the copper oxide constituting the finely roughened layer on the copper foil in at least those parts of the inner-layer board which are close to the through-holes, said reduction being conducted during the period between said through-hole formation and electroless plating in an atmosphere in which a reducing gas is present.

10. A process as claimed in claim 9, wherein the treatment in an atmosphere in which a reducing gas is present is conducted during the period between desmear treatment and electroless plating.

11. A process as claimed in claim 9, wherein said reducing gas is hydrogen, carbon monoxide, or a mixture thereof.

12. A process as claimed in claim 9, wherein said reducing gas is hydrazine gas.

* * * * *